(12) United States Patent
Osada

(10) Patent No.: US 6,919,223 B2
(45) Date of Patent: Jul. 19, 2005

(54) METHOD OF MANUFACTURING SEMICONDUCTOR RESIN MOLDING AND RESIN MEMBER EMPLOYED THEREFOR

(75) Inventor: Michio Osada, Kyoto (JP)

(73) Assignee: Towa Corporation, Kyoto (JP)

( * ) Notice: Subject to any disclaimer, the term of this patent is extended or adjusted under 35 U.S.C. 154(b) by 46 days.

(21) Appl. No.: 10/456,435

(22) Filed: Jun. 6, 2003

(65) Prior Publication Data

US 2003/0235938 A1 Dec. 25, 2003

(30) Foreign Application Priority Data

Jun. 24, 2002 (JP) ........................................ 2002-183275

(51) Int. Cl.⁷ ............................................... H01l 21/44
(52) U.S. Cl. ...................................... 438/106; 438/110
(58) Field of Search .................................. 438/106, 108, 438/112, 113, 118, 114, 110, 124; 257/777, 778

(56) References Cited

U.S. PATENT DOCUMENTS

| | | | | |
|---|---|---|---|---|
| 5,079,190 A | * | 1/1992 | Mihara | 438/26 |
| 6,313,521 B1 | * | 11/2001 | Baba | 257/678 |
| 6,429,043 B1 | * | 8/2002 | Nakazawa et al. | 438/106 |
| 6,627,997 B1 | * | 9/2003 | Eguchi et al. | 257/777 |
| 6,767,767 B2 | * | 7/2004 | Hayashida et al. | 438/124 |
| 6,774,466 B1 | * | 8/2004 | Kajiwara et al. | 257/673 |

* cited by examiner

Primary Examiner—Howard Weiss
Assistant Examiner—(Vikki) Hoa B. Trinh
(74) Attorney, Agent, or Firm—W. F. Fasse; W. G. Fasse

(57) ABSTRACT

A space portion is present between the upper surface of a semiconductor chip of a semiconductor chip mounted substrate fitted into a cavity (concave portion for setting) of a lower mold section and the top surface of a cavity of an upper mold section. The upper and lower mold sections are closed while a resin member having a thickness larger than the height of the space portion is inserted in the space portion. At this time, clamping force between the upper and lower mold sections is applied to the semiconductor chip through the resin member. The resin member is deformed in response to the shape of the space portion. Underfill is molded between the semiconductor chip and the substrate while the resin member adheres to both of the upper surface of the semiconductor chip and the top surface of the cavity of the upper mold section. Consequently, the underfill resin is prevented from flowing into a clearance between the upper surface of the semiconductor chip and the top surface of the cavity of the upper mold section. Thus, the upper surface of the semiconductor chip is prevented from formation of a resin molding flash.

8 Claims, 11 Drawing Sheets

METHOD OF MANUFACTURING SEMICONDUCTOR RESIN MOLDING AND RESIN MEMBER EMPLOYED THEREFOR

BACKGROUND OF THE INVENTION

1. Field of the Invention

The present invention relates to a method of manufacturing a semiconductor resin molding by molding underfill resin on a semiconductor chip mounted substrate (flip chip mounted substrate) formed by mounting a semiconductor chip on a substrate through a bump (connecting electrode) and a resin member employed therefor.

2. Description of the Background Art

A semiconductor chip mounted substrate on which a plurality of semiconductor chips are mounted through bumps (connecting electrodes) is employed in general. In the semiconductor chip mounted substrate, underfill resin is injected between each of the plurality of semiconductor chips and the substrate in a subsequent step. Thereafter required portions of the resin-injected substrate are cut, for manufacturing individual semiconductor resin moldings.

In the step of injecting the underfill resin, a mold comprising an upper mold section fixed in position and a lower mold section movable in position is employed. In the step of cutting the resin-injected substrate, a cutter comprising a platform sucking the resin-injected substrate thereby fixing the position thereof and a blade (cutting blade) cutting the positionally fixed resin-injected substrate is employed.

Conventional steps of manufacturing a semiconductor resin molding are now more specifically described.

First, both of the upper and lower mold sections are heated to a prescribed temperature in advance of the step of injecting the underfill resin.

Then, the semiconductor chip mounted substrate is fitted into a cavity (concave portion for setting) of the lower mold section. Thereafter the upper and lower mold sections are closed, thereby collectively fitting the plurality of semiconductor chips into a cavity for resin injection provided on the upper mold section.

The underfill resin is heated and melted in a pot for supplying a resin material provided on the lower mold section.

Thereafter the underfill resin is pressurized with a plunger for resin pressurization. Then, the melted underfill resin is injected into the cavity of the upper mold section through a resin passage. Thus, the underfill resin fills up a clearance between each of the plurality of semiconductor chips and the substrate. After a lapse of a time necessary for hardening the underfill resin, the upper and lower mold sections are opened. Thereafter a semiconductor resin-molded substrate resin-molded in the cavity is taken out from the mold.

In general, the heights of the plurality of semiconductor chips, including the thicknesses of the semiconductor chips and the heights of the bumps, are dispersed. Regardless of the depth of the cavity of the upper mold section, i.e., the distance between the mold surface of the upper mold section and the top surface of the cavity, therefore, this dispersion results in the following problems:

When the depth of the cavity of the upper mold section is set to the maximum value among the heights of the semiconductor chips, for example, a clearance is defined between the upper surface of the semiconductor chip other than that having the maximum height and the top surface of the cavity of the upper mold section. Thus, the melted underfill resin infiltrates into this clearance thereby forming a resin molding flash (casting fin) on the upper surface of the semiconductor chip. Further, the semiconductor chips cannot be pressed against the substrate with the top surface of the cavity of the upper mold section. Consequently, the pressure of the melted underfill resin injected into the cavity may exceed mounting force (adhesion) between the semiconductor chips and the substrate. In this case, the semiconductor chips are separated from the substrate due to the fluid pressure of the melted resin. In other words, the semiconductor chip mounted substrate is broken.

When the depth of the cavity of the upper mold section is set to the minimum value among the heights of the semiconductor chips, the upper surface of the semiconductor chip other than that having the minimum depth is strongly pressed against the top surface of the cavity of the upper mold section. Thus, the semiconductor chip mounted substrate is damaged.

When the depth of the cavity of the upper mold section is set to the mean (average) value of the heights of the semiconductor chips, resin molding flashes are readily formed on the upper surfaces of the semiconductor chips and the semiconductor chip mounted substrate is readily damaged.

SUMMARY OF THE INVENTION

An object of the present invention is to provide a method of manufacturing a semiconductor resin molding capable of preventing a semiconductor chip mounted substrate from formation of a resin molding flash and a resin member employed therefor.

Another object of the present invention is to provide a method of manufacturing a semiconductor resin molding capable of preventing a semiconductor chip of a semiconductor chip mounted substrate from damage and a resin member employed therefor.

In order to attain the aforementioned objects, the present invention provides the following method of manufacturing a semiconductor resin molding:

First, a mold having an upper mold section and a lower mold section is prepared.

Then, a semiconductor chip mounted substrate formed by mounting a semiconductor chip on a substrate through a connecting electrode (bump) is prepared.

Thereafter the semiconductor chip mounted substrate is fitted into a cavity (concave portion for setting) of the lower mold section.

Then, a resin member having a thickness larger than the height of a clearance defined (existing) between the top surface of a cavity of the upper mold section and the upper surface of the semiconductor chip when the upper mold section and the lower mold section are closed is set on the upper surface of the semiconductor chip.

Thereafter the upper mold section and the lower mold section are closed, thereby applying pressure from the upper mold section to the resin member.

Then, underfill melted resin is injected into a clearance between the semiconductor chip and the substrate to fill up this clearance while applying the pressure from the upper mold section to the resin member, so that the underfill resin is molded.

In the aforementioned method of manufacturing a semiconductor resin molding, the resin member having the thickness larger than the height of the clearance defined between the top surface of the cavity of the upper mold section and the upper surface of the semiconductor chip is employed.

According to the method of manufacturing a semiconductor resin molding employing the aforementioned resin member, the upper mold section and the lower mold section are closed while the resin member is present between the top surface of the cavity of the upper mold section and the upper surface of the semiconductor chip. Therefore, pressure is transmitted from the top surface of the cavity of the upper mold section to the upper surface of the semiconductor chip through the resin member. At this time, the resin member is deformed in response to the shape of the clearance between the upper surface of the semiconductor chip and the top surface of cavity of the upper mold section.

Therefore, the space between the upper surface of the semiconductor chip and the top surface of the cavity of the upper mold section is filled up with the deformed resin member. Therefore, the underfill resin is prevented from infiltrating into the space between the upper surface of the semiconductor chip and the top surface of the cavity of the upper mold section. Consequently, the upper surface of the semiconductor chip is prevented from formation of a resin molding flash.

Further, the resin member is so deformed as to inhibit the top surface of the cavity of the upper mold section from applying extremely large pressure to the upper surface of the semiconductor chip. Therefore, damage of the semiconductor chip mounted substrate, due to the pressure applied from the top surface of the cavity of the upper mold section to the semiconductor chip, is prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
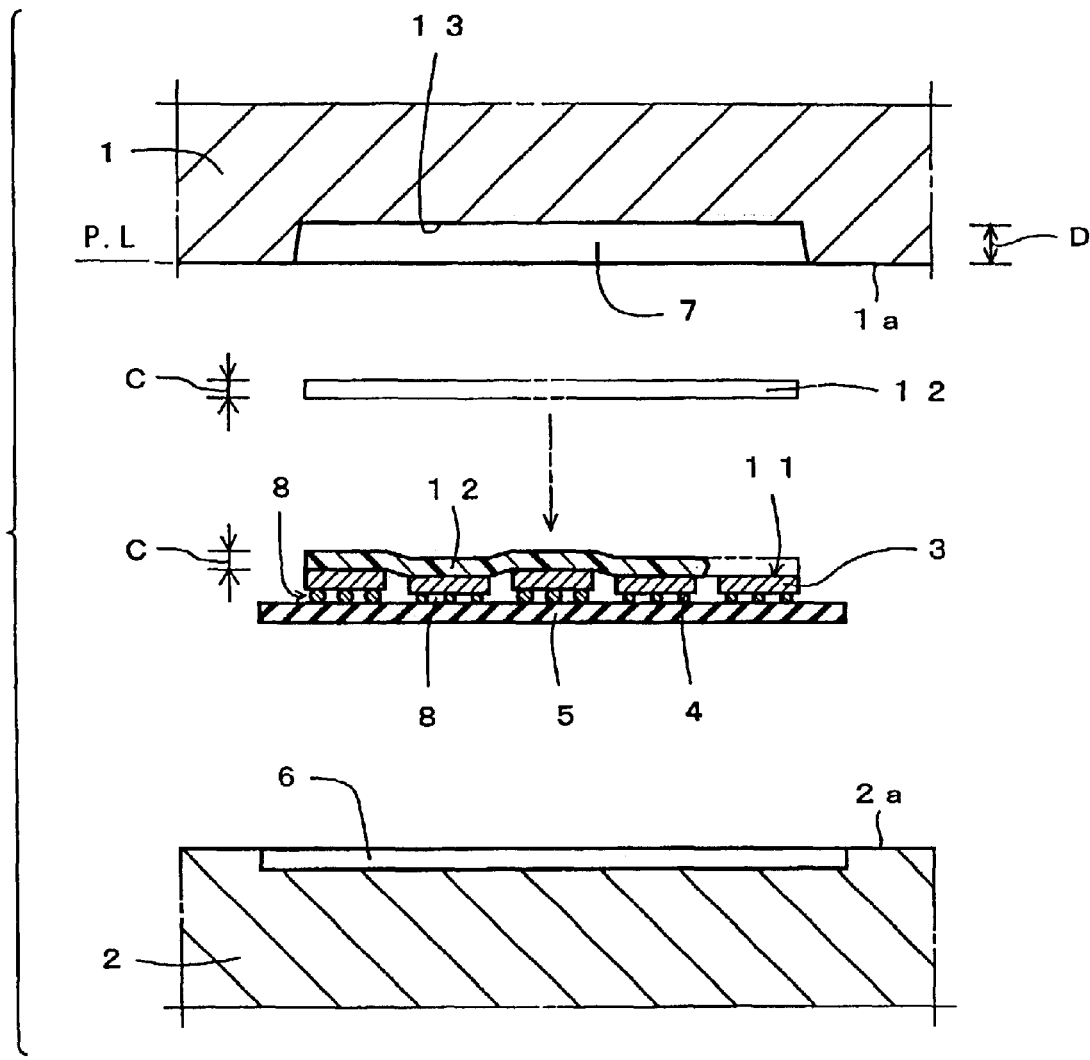
FIG. 1 is a partially fragmented longitudinal sectional view for schematically illustrating the structure of a mold employed for a method of manufacturing a semiconductor resin molding according to a first embodiment of the present invention in an open state of the mold.

Methods of manufacturing semiconductor resin moldings and resin members employed therefor according to embodiments of the present invention are now described with reference to the drawings.

(First Embodiment)

A method of manufacturing a semiconductor resin molding and a resin member employed therefor according to a first embodiment of the present invention is described with reference to FIGS. 1, 2, 3, 4, 5, 6, 7 and 8.

A step of filling up clearances 8 between semiconductor chips 3 and a substrate 5 with underfill resin 9 is described with reference to FIGS. 1 to 5.

A mold employed for the method of manufacturing a semiconductor resin molding according to the first embodiment comprises an upper mold section 1 fixed in position and a lower mold section 2 arranged oppositely to the upper mold section 1 and movable in position. The mold is further provided with a mechanism (not shown) moving the lower mold section 2 upward thereby clamping the upper and lower mold sections 1 and 2 with prescribed pressure. The mold is also provided with heating means (not shown) capable of heating the upper and lower mold sections 1 and 2 to a prescribed temperature.

The lower mold section 2 is provided with a cavity (concave portion for setting) 6 for receiving the substrate 5. The plurality of semiconductor chips 3 are integrally mounted on the substrate 5 through bumps 4 serving as connecting electrodes. The upper mold section 1 is provided with a cavity 7 serving as a concave portion for resin injection having a depth D. The plurality of semiconductor chips 3 are collectively fitted into the cavity 7. As shown in FIG. 1, the depth D of the cavity 7 corresponds to the distance between a mold surface 1a of the upper mold section 1 and a top surface 13 of the cavity 7.

Figure 2:
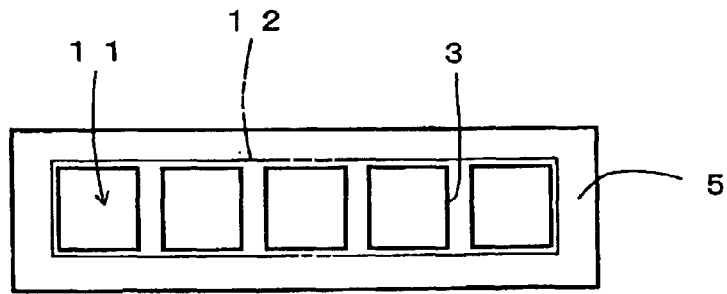
FIG. 2 is a plan view for schematically illustrating the structure of a semiconductor chip mounted substrate employed for the method of manufacturing a semiconductor resin molding according to the first embodiment.
Figure 3:
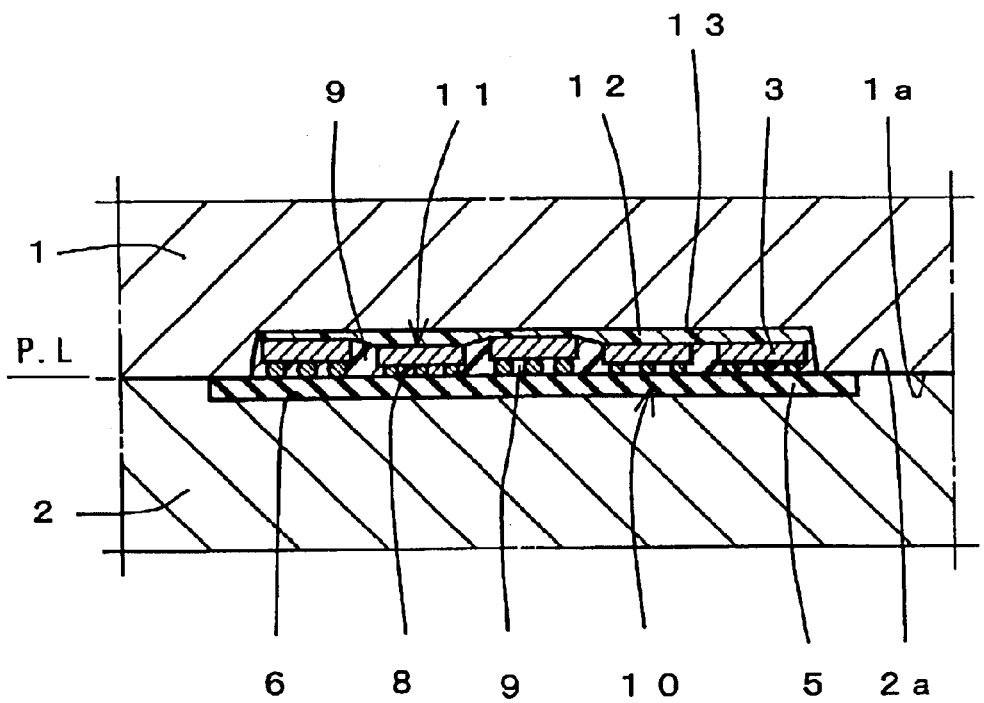
FIG. 3 is a partially fragmented longitudinal sectional view for schematically illustrating the structure of the mold employed for the method of manufacturing a semiconductor resin molding according to the first embodiment in a closed state of the mold.

As shown in FIG. 2, the plurality of semiconductor chips 3 are aligned with each other on the substrate 5. When the upper and lower mold sections 1 and 2 shown in FIG. 1 are closed, the mold is in a state shown in FIG. 3.

Figure 4:
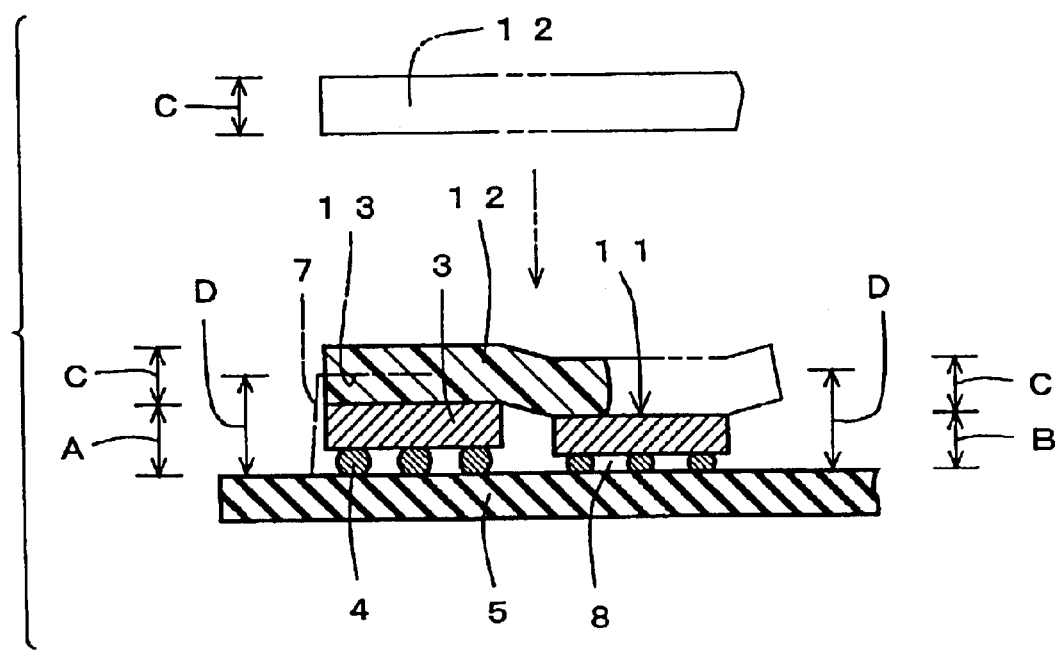
FIG. 4 is a partially fragmented longitudinal sectional view of the semiconductor chip mounted substrate employed in the first embodiment.
Figure 5:
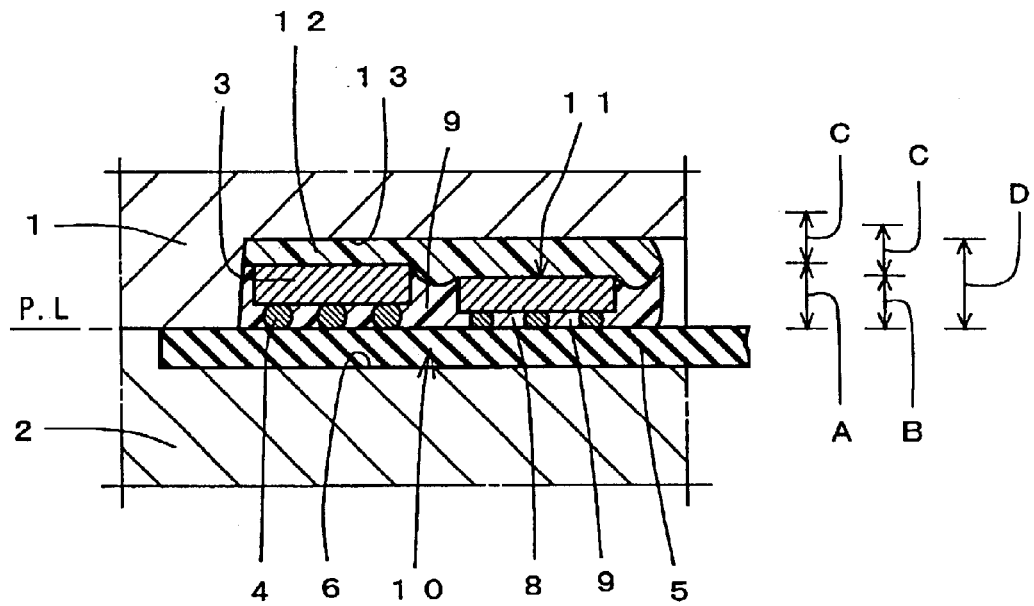
FIG. 5 is a partially fragmented longitudinal sectional view showing a principal part of the semiconductor chip mounted substrate shown in FIG. 3 in an enlarged manner.

As shown in FIG. 4, the heights of the semiconductor chips 3 carried on the substrate 5, i.e., values including the heights of the bumps 4 and the thicknesses of the semiconductor chips 3, are dispersed. For example, symbols A and B appearing in FIG. 4 denote the heights of two semiconductor chips 3 respectively. Referring to FIG. 4, the height A of the left semiconductor chip 3 is larger than the height B of the right semiconductor chip 3. When the upper and lower mold sections 1 and 2 are closed, the upper surface (semiconductor chip mounted surface) of the substrate 5 is aligned with the plane of a parting line P.L between the upper and lower mold sections 1 and 2, as shown in FIG. 5.

The upper and lower mold sections 1 and 2 are provided with resin injection mechanisms (not shown) or the like for injecting melted underfill resin 9 with prescribed pressure. Each resin injection mechanism includes a pot for supplying a resin material, a plunger for resin pressurization fitted into the pot and a resin passage, such as a runner or a gate, connecting the cavity 7 with the pot, for example.

Such resin injection mechanisms are so employed as to pressurize the resin materials heated and melted in the pots with the plungers, thereby injecting the resin materials into the cavity 7 with the prescribed pressure. Further, the melted underfill resin 9 is injected into the clearances 8 between the plurality of semiconductor chips 3 fitted in the cavity 7 and the substrate 5. Thus, a resin-injected substrate 10 is formed in the cavity 7.

As shown in FIG. 2, a tapelike resin member 12 is attached to upper surfaces 11 of the respective ones of the semiconductor chips 3 aligned with each other on the substrate 5.

In the cavity 7, a space for interposing the resin member 12 is present between the upper surfaces 11 of the semiconductor chips 3 and the top surface 13 of the cavity 7 of the upper mold section 1. According to this embodiment, the upper and lower mold sections 1 and 2 are closed while interposing the resin member 12 between the top surface 13 of the cavity 7 and the upper surfaces 11 of the semiconductor chips 3 fitted into the cavity 7.

This resin member 12 is employed for preventing formation resin molding flashes as well as pressing the semiconductor chips 3 against the substrate 5 for fixing the former to the latter, as described later.

As shown in FIGS. 1 and 4, the depth D of the cavity 7 of the upper mold section 1 is smaller than the sum of the height A or B of each semiconductor chip 3 and the thickness C of the resin member 12.

When the upper and lower mold sections 1 and 2 are closed, therefore, the resin member 12 interposed in the cavity 7 can be pressed against the semiconductor chips 3 with prescribed pressure through the top surface 13 of the cavity 7.

At this time, the heating means heats the resin member 12 to the prescribed temperature in the cavity 7, thereby flexibly deforming the resin member 12. The heating means heats the resin member 12 by a method employed in a general step of injecting underfill resin.

In the aforementioned method of manufacturing a semiconductor resin molding according to this embodiment, the melted underfill resin 9 is injected into the cavity 7 with the prescribed pressure while the resin member 12 is pressed against the upper surfaces 11 of the semiconductor chips 3 with the prescribed pressure. At this time, the underfill resin 9 is injected into the clearances 8 between the semiconductor chips 3 and the substrate 5. However, the deformed resin member 12 adheres to the inner surface of the cavity 7. Therefore, the melted underfill resin 9 is prevented from infiltrating (flowing) into clearances between the resin member 12 and the upper surfaces 11 of the semiconductor chips 3. Thus, the upper surfaces 11 of the semiconductor chips 3 are prevented from formation of resin molding flashes.

In the method of manufacturing a semiconductor resin molding according to this embodiment, the resin member 12 presses the semiconductor chips 3 against the substrate 5 with the prescribed pressure. Thus, the semiconductor chips 3 are prevented from being separated from the substrate 5 by the pressure of the underfill resin 9 injected into the cavity 7. Therefore, the semiconductor chips 3 for semiconductor resin moldings are prevented from damage.

The prescribed pressure applied from the top surface 13 of the cavity 7 to the semiconductor chips 3 preferably exceeds the pressure of the underfill resin 9 injected into the cavity 7. In other words, influence exerted on the semiconductor chips 3 by the pressure for injecting the underfill resin 9 is preferably smaller than influence exerted by the resin member 12 pressing the semiconductor chips 3. Thus, the semiconductor chips 3 can be more reliably prevented from being separated from the substrate 5.

According to this embodiment, the resin member 12 is prepared from thermosetting resin. Therefore, the resin member 12 is heated and pressed to be deformed. According to this embodiment, therefore, the top surface 13 of the cavity 7 of the upper mold section 1 presses the upper surfaces 11 of the semiconductor chips 3 with the prescribed pressure through the resin member 12 regardless of the hardened state (completely hardened, semi-hardened or partially hardened, for example) of the resin member 12.

The resin member 12 is preferably flexible and windable before the same is heated, and deformed and semi-hardened when heated and pressed.

The resin member 12 may alternatively be prepared from thermoplastic resin (preferably heat-resistant thermoplastic resin).

The resin member 12 may further alternatively be prepared from a material having elasticity (elastic material) such as elastomer, for example.

A step of dividing the resin-injected substrate 10 into a plurality of semiconductor resin moldings 15 corresponding to the plurality of semiconductor chips 3 respectively is now described with reference to FIGS. 6 to 8.

A cutter (not shown) for cutting the resin-injected substrate 10 is provided with a platform sucking and fixing the resin-injected substrate 10 and a blade (rotary cutting blade) cutting required positions (assumed cut portions) of the resin-injected substrate 10 fixed to the platform. Referring to FIG. 6, the assumed cut portions are cut along arrows 14.

Figure 6:
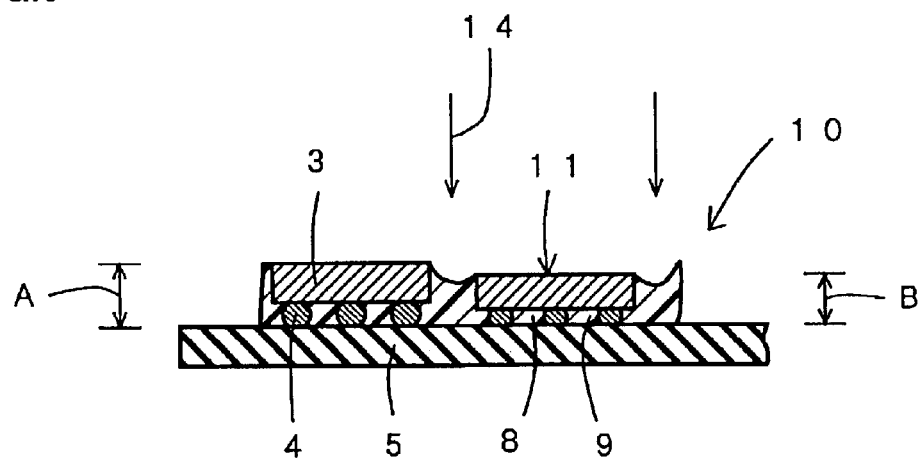
FIG. 6 is a partially fragmented longitudinal sectional view showing a resin-injected substrate employed for the method of manufacturing a semiconductor resin molding according to the first embodiment.

In the step of forming the semiconductor resin moldings 15, the resin-injected substrate 10 shown in FIG. 6 is fixed to the platform. Then, the blade cuts the assumed cut portions of the resin-injected substrate 10 along arrows 14, thereby dividing the resin-injected substrate 10 into a plurality of semiconductor resin moldings 15 corresponding to the plurality of semiconductor chips 3 respectively.

Consequently, each semiconductor resin molding 15 is so formed that each semiconductor chip 3 is carried on each divided section of the substrate 5. In this semiconductor resin molding 15, the underfill resin 9 fills up the clearance between the divided section of the substrate 5 and the semiconductor chip 3.

Figure 7:
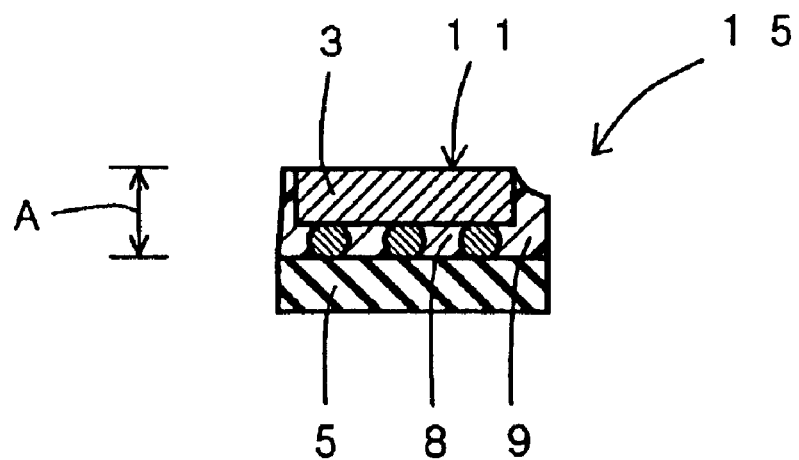
FIGS. 7 and 8 are sectional views of semiconductor resin moldings manufactured by the method of manufacturing a semiconductor resin molding according to the first embodiment.
Figure 8:
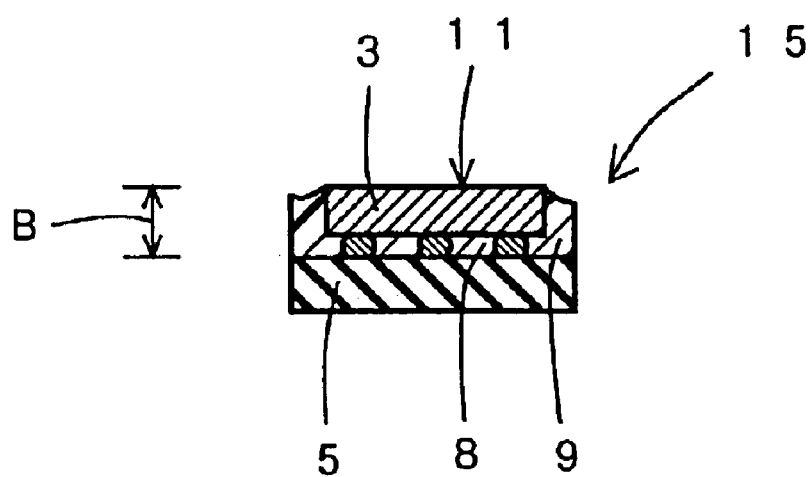

FIG. 7 shows the semiconductor resin molding 15 provided with the semiconductor chip 3 having the height A. FIG. 8 shows the semiconductor resin molding 15 provided with the semiconductor chip 3 having the height B.

(Second Embodiment)

Figure 9:
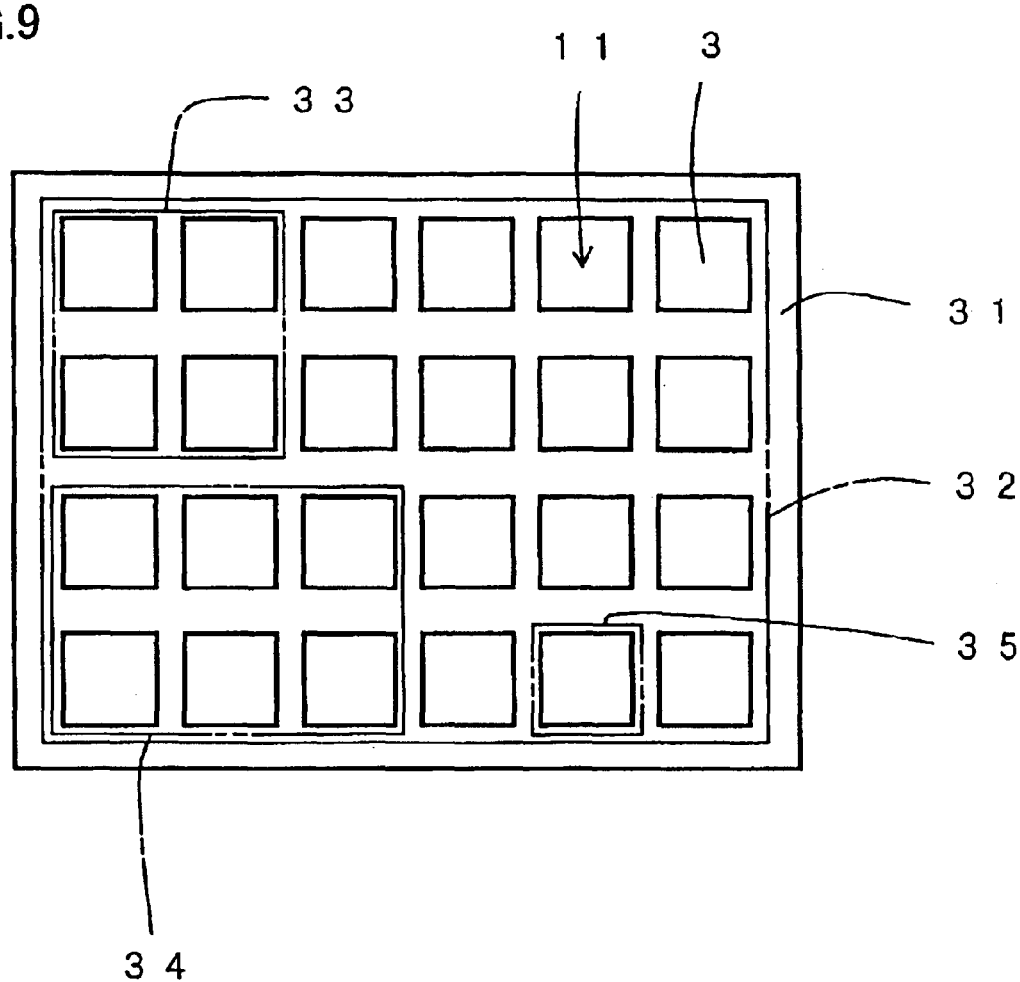
FIG. 9 is a plan view for schematically illustrating the structure of a semiconductor chip mounted substrate employed for a method of manufacturing a semiconductor resin molding according to a second embodiment of the present invention.

A method of manufacturing a semiconductor resin molding and a resin member employed therefor according to a second embodiment of the present invention are now described with reference to FIG. 9. FIG. 9 shows a semiconductor chip mounted substrate 31 formed by arranging a plurality of semiconductor chips 3 on a single substrate in the form of a matrix.

In the semiconductor chip mounted substrate 5 employed in the first embodiment, the plurality of semiconductor chips 3 are aligned with each other on the substrate 5 and the tapelike resin member 12 is attached to the upper surfaces 11 of the plurality of semiconductor chips 3. In the semiconductor chip mounted substrate 31 employed in the second embodiment, any of resin members 32, 33, 34 and 35 having a thickness C is attached to the upper surface 11 of each of the plurality of semiconductor chips 3 arranged on the substrate 31 in the form of a matrix.

The substrate 31 shown in FIG. 9 carries 24 semiconductor chips 3 in total in four vertical columns and six transverse rows. The 24 semiconductor chips 3 are dispersed in height. The relation between the depth D of a cavity 7 of an upper mold section 1 receiving the semiconductor chips 3, the heights A and B of the semiconductor chips 3 and the heights of the resin members 32, 33, 34 and 35 employed in the second embodiment is identical to that in the first embodiment.

According to this embodiment, the resin member 35 having dimensions and a shape corresponding to the dimensions and the shape of each semiconductor chip 3 or each aggregate of the plurality of semiconductor chips 3 is mounted on the semiconductor chip mounted substrate 31, as shown in FIG. 9.

Alternatively, the filmlike resin member 32 may be collectively attached to the overall semiconductor chips 3 (24 semiconductor chips 3 in FIG. 9) arranged in the form of a matrix as shown in FIG. 9, for example.

In this case, the filmlike resin member (film member) 32 is attached to the upper surfaces 11 of the 24 semiconductor chips 3, which in turn are collectively fitted into the cavity 7 of the upper mold section 1.

Further alternatively, the filmlike resin member 33 may be attached to each aggregate of four (two by two) semiconductor chips 3, as shown in FIG. 9. Further alternatively, the filmlike resin member 34 may be attached to each aggregate of the upper surfaces 11 of six (two by three) semiconductor chips 3.

In this case, the semiconductor chip mounted substrate 31 is provided with six (four) aggregates each formed by collectively attaching the filmlike resin member 33 (34) on the upper surfaces of the four (six) semiconductor chips 3. The cavity 7 may be divided into six (four) portions in correspondence to the units of the aggregates respectively. Alternatively, the cavity 7 of the upper mold section 1 may be undivided so that all of the six (four) aggregates are collectively fitted therein.

Further alternatively, the resin member 35 corresponding to the dimensions and the shape of each semiconductor chip 3 may be attached to the upper surface 11 of each semiconductor chip 3, as shown in FIG. 9.

In this case, the upper mold section 1 may be provided with 24 cavities 7 in correspondence to the 24 semiconductor chips 3 respectively. Alternatively, the cavity 7 of the upper mold section 1 may be undivided so that all of the 24 semiconductor chips 3 are collectively fitted therein.

Also when any of the aforementioned resin members 32, 33, 34 and 35 is employed, an effect similar to that attained by the method of manufacturing a semiconductor resin molding according to the first embodiment can be attained.

(Third Embodiment)

A method of manufacturing a semiconductor resin molding and a resin member employed therefor according to a third embodiment of the present invention is now described with reference to FIGS. 10, 11 and 12.

Figure 10:
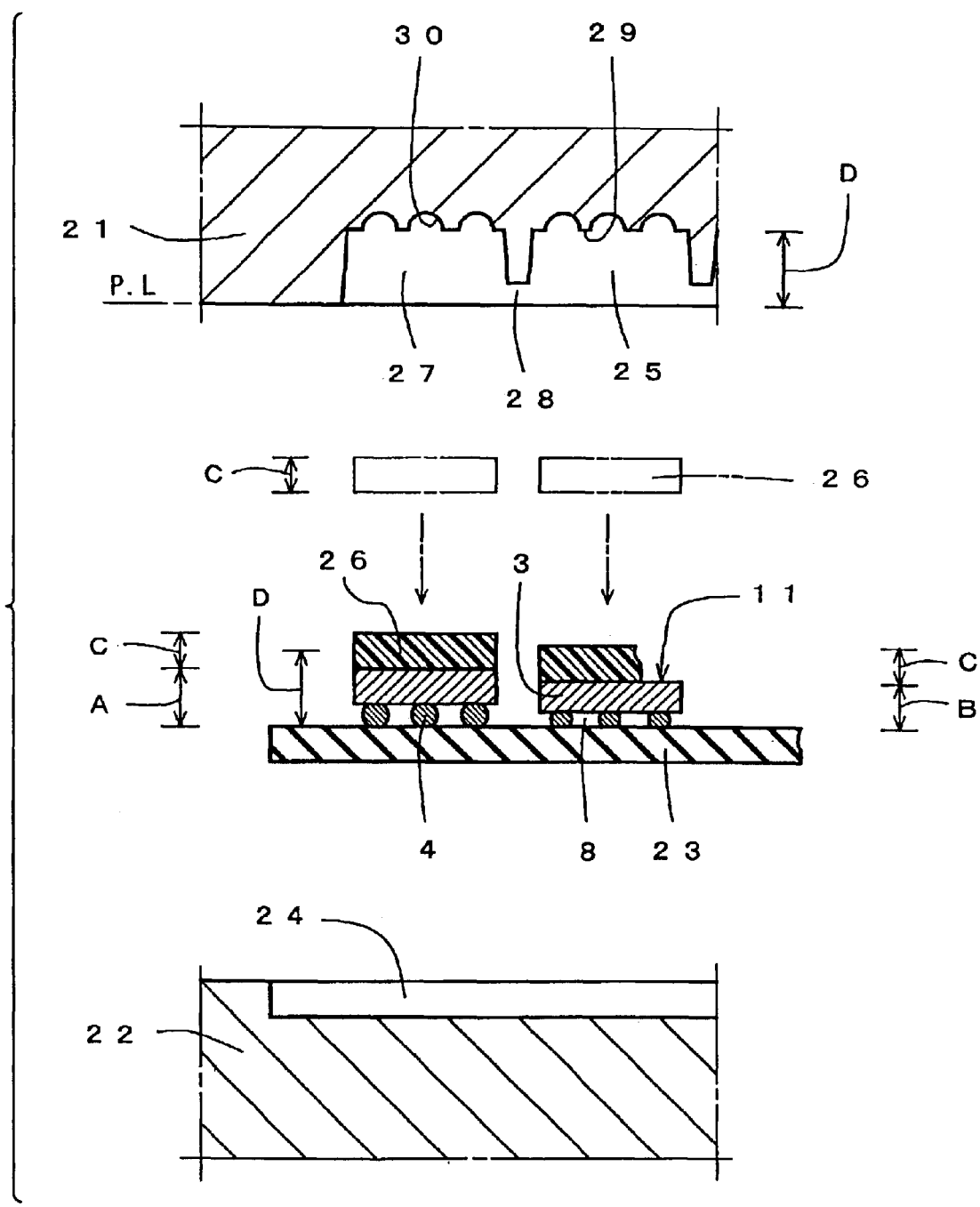
FIG. 10 is a partially fragmented longitudinal sectional view for schematically illustrating the structure of a mold employed for a method of manufacturing a semiconductor resin molding according to a third embodiment of the present invention in an open state of the mold.
Figure 11:
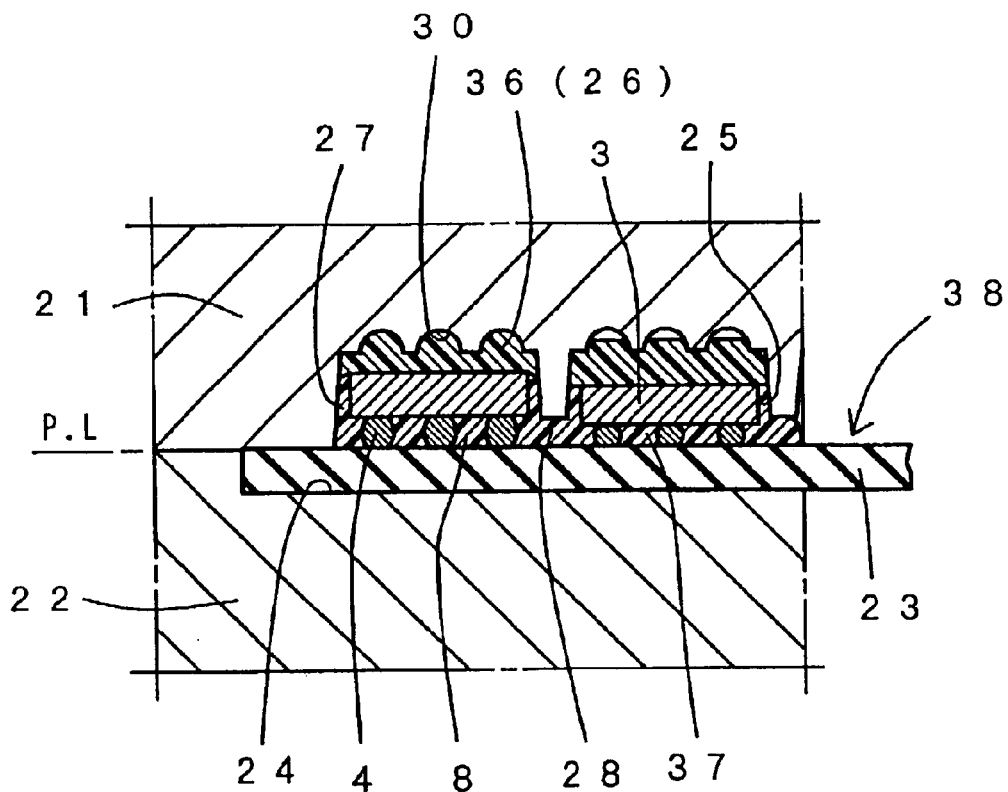
FIG. 11 is a partially fragmented longitudinal sectional view for schematically illustrating the structure of the mold employed for the method of manufacturing a semiconductor resin molding according to the third embodiment in a closed state of the mold.

As shown in FIGS. 10 and 11, a mold employed for the method of manufacturing a semiconductor resin molding according to this embodiment comprises an upper mold section 21 fixed in position and a lower mold section 22 movable in position. The lower mold section 22 is provided with a cavity (concave portion for setting) 24 for receiving a substrate 23. A plurality of semiconductor chips 3 are integrally mounted on the substrate 23 through connecting electrodes (bumps) 4.

The upper mold section 21 is provided with a cavity 25 for resin injection having a depth D. The plurality of semiconductor chips 3 are fitted into the cavity 25. A resin member 26 having a thickness C is individually attached to the upper surface 11 of each of the plurality of semiconductor chips 3 mounted an the substrate 23. Heights A and B of the semiconductor chips 3 are dispersed. The depth D of the cavity 25 is smaller than the sum of the height A or B of each semiconductor chip 3 and the thickness C of each resin member 26.

The cavity 25 of the upper mold section 21 is provided with a plurality of storage portions (small cavities) 27 storing the resin members 26 attached to the upper surfaces 11 of the semiconductor chips 3. The cavity 25 is further provided with a communication passage 28 connecting the storage portions 27 with each other.

Therefore, underfill resin 37 injected into a clearance 8 between each semiconductor chip 3 and the substrate 23 fills up each storage portion 27 through the communication passage 28 in the cavity 25.

A top surface 29 of each storage portion 27 (the cavity 25) is provided with adjusting portions (small concave portions) 30 allowing deformation of the resin member 26 attached to the upper surface 11 of each semiconductor chip 3 stored in the storage portion 27 and receiving the same when the upper and lower mold sections 21 and 22 are closed. The adjusting portions 30 are employed for receiving excess parts of each resin member 26. When the upper and lower mold sections 21 and 22 are closed, therefore, the adjusting portions 30 partially store the resin member 26 also when the volume of the resin member 26 is excessive.

The underfill resin 37 is injected into the cavity 25 while applying prescribed pressure from the top surface 29 of the upper mold section 21 to the upper surfaces 11 of the semiconductor chips 3 through deformed resin members 36 (26). Thus, the underfill resin 37 reliably fills up the clearances 8 between the semiconductor chips 3 and the substrate 23.

Figure 12:
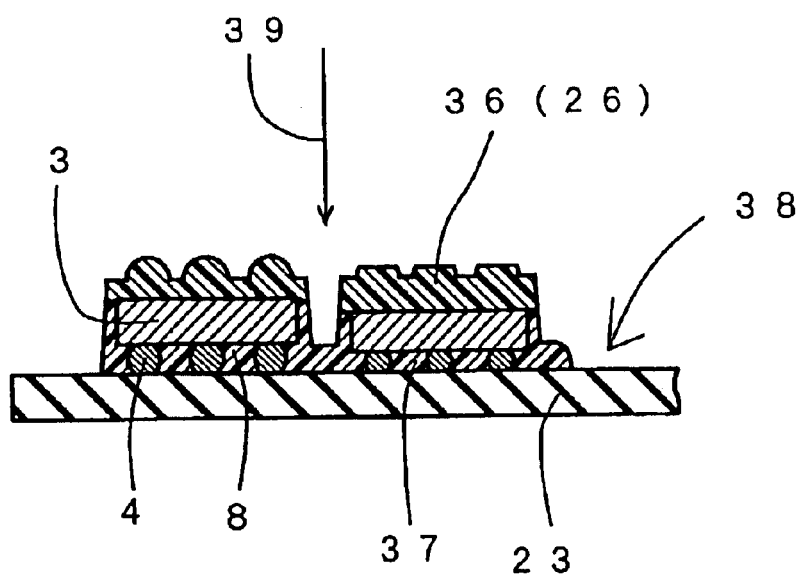
FIG. 12 is a partially fragmented longitudinal sectional view showing z resin-injected substrate employed for the method of manufacturing a semiconductor resin molding according to the third embodiment.

As shown in FIG. 12, an assumed cut portion of a resin-injected substrate 38 is cut along arrow 39. Thus, the resin-injected substrate 38 is divided into individual semiconductor resin moldings.

The aforementioned method of manufacturing a semiconductor resin molding can also attain an effect similar to those attained by the methods of manufacturing semiconductor resin moldings according to the first and second embodiments.

(Fourth Embodiment)

A method of manufacturing a semiconductor resin molding and a resin member employed therefor according to a fourth embodiment of the present invention are now described with reference to FIGS. 13, 14, 15 and 16.

First, a method of manufacturing a semiconductor resin molding and a resin member employed therefor according to a first example of the fourth embodiment are described with reference to FIGS. 13 and 14.

Figure 13:
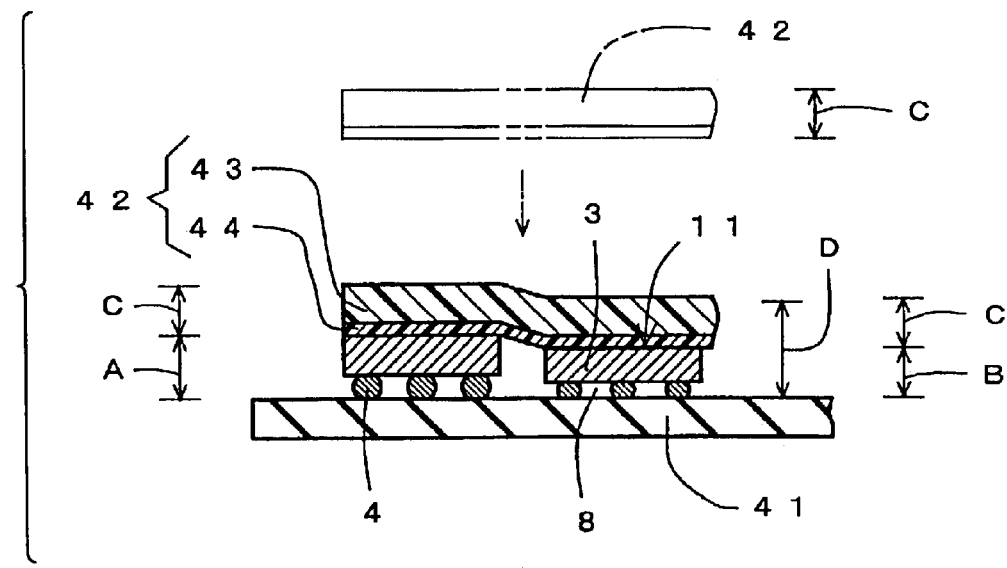
FIG. 13 is a partially fragmented longitudinal sectional view showing principal parts of a semiconductor chip mounted substrate, a resin member and a bonding layer employed for a first exemplary method of manufacturing a semiconductor resin molding according to a fourth embodiment of the present invention in an enlarged manner.

A plurality of semiconductor chips 3 are mounted on a substrate 41 shown in FIG. 13 through bumps (connecting electrodes) 4. The heights of the semiconductor chips 3, including the thicknesses of the semiconductor chips 3 and the heights of the bumps 4, are dispersed. Referring to FIG. 13, symbols A and B denote the heights of the semiconductor chips 3. The height A is larger than the height B.

A resin member 42 having a required thickness C shown in FIG. 13 is formed by two layers, i.e., a base layer 43 serving as the body of the resin member 42 and a bonding layer 44 for preventing formation of clearances between the semiconductor chips 3 and the resin member 42. The bonding layer 44 has prescribed adhesion for tentative fixation. A mold shown in FIG. 14 is provided with an upper mold section 45 fixed in position and a lower mold section 46, arranged oppositely to the upper mold section 45, movable in position.

The lower mold section 46 is provided with a cavity (concave portion for setting) 47 for receiving the substrate 41. The upper mold section 45 is provided with a cavity 48 into which underfill resin 49 is injected. The upper and lower mold sections 45 and 46 are provided with various mechanisms for injecting the underfill resin 49 into clearances 8 between the plurality of semiconductor chips 3 and the substrate 41 in the cavity 48. After the substrate 41 is fitted into the cavity (concave portion for setting) 47 of the lower mold section 46, the upper and lower mold sections 45 and 46 are closed by moving the lower mold section 46 upward.

As shown in FIG. 13, the resin member 42 is tentatively fixed to the upper surfaces 11 of the plurality of semiconductor chips 3 while facing the surface provided with the bonding layer 44 for preventing formation of clearances to the upper surfaces 11 of the semiconductor chips 3.

At this time, the underfill resin 49 fills up the clearances 8 between the plurality of semiconductor chips 3 and the substrate 41 in a space formed by the cavity 48 of the upper mold section 45 and the cavity (concave portion for setting) 47 of the lower mold section 46. Consequently, a resin-injected substrate 50 is formed.

The depth D of the cavity 48 is smaller than the sum of the height A or B of each semiconductor chip 3 and the thickness C of the two-layer resin member 42. When the upper and lower mold sections 45 and 46 are closed, therefore, a top surface 57 of the cavity 48 presses (and heats) the upper surfaces 11 of the semiconductor chips 3 with prescribed pressure through the resin member 42. At this time, no clearances are defined between the bonding layer 44 of the resin member 42 and the upper surfaces 11 of the semiconductor chips 3 due to synergistic action of the aforementioned prescribed pressure and the adhesion between the semiconductor chips 3 and the bonding layer 44.

Then, the upper and lower mold sections 45 and 46 are opened. Thus, the resin-injected substrate 50 formed in the cavity 48 is taken out in such a state that the resin member 42 is bonded to the upper surfaces 11 of the semiconductor chips 3. Thereafter the resin member 42 is separated from the upper surfaces 11 of the semiconductor chips 3 in the resin-injected substrate 50. Then, required portions of the resin-injected substrate 50 are cut so that the resin-injected substrate 50 is divided into individual semiconductor resin moldings.

The method of manufacturing a semiconductor resin molding described with reference to FIGS. 13 and 14 can also attain an effect similar to those attained by the methods of manufacturing semiconductor resin moldings according to the first and second embodiments.

A method of manufacturing a semiconductor resin molding and a resin member employed therefor according to a second example of the fourth embodiment are now described with reference to FIGS. 15 and 16.

Figure 15:
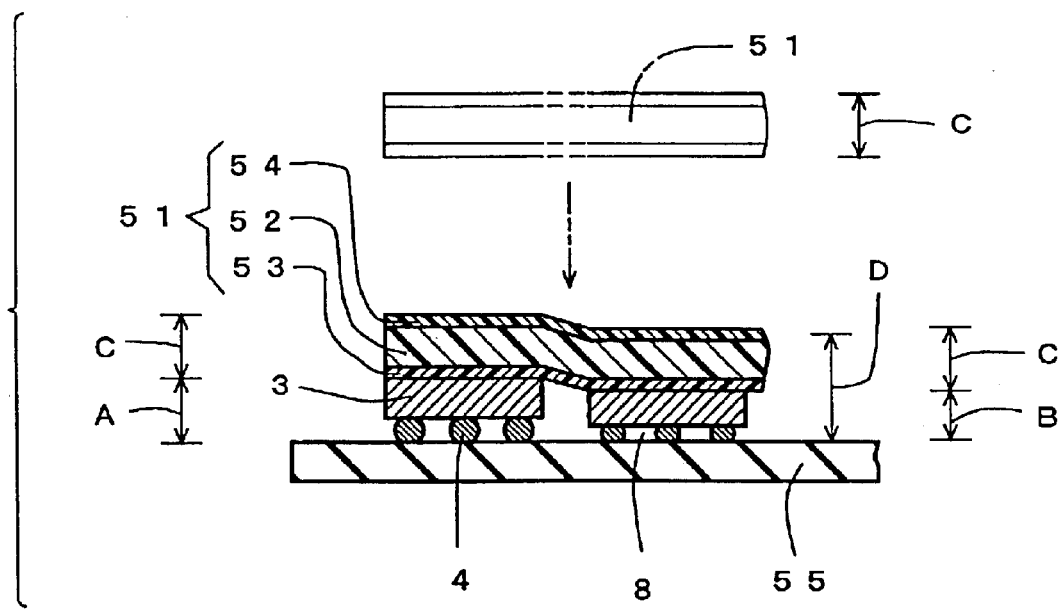
FIG. 15 is a partially fragmented longitudinal sectional view showing principal parts of a semiconductor chip mounted substrate, a resin member and a bonding layer employed for a second exemplary method of manufacturing a semiconductor resin molding according to the fourth embodiment in an enlarged manner.
Figure 16:
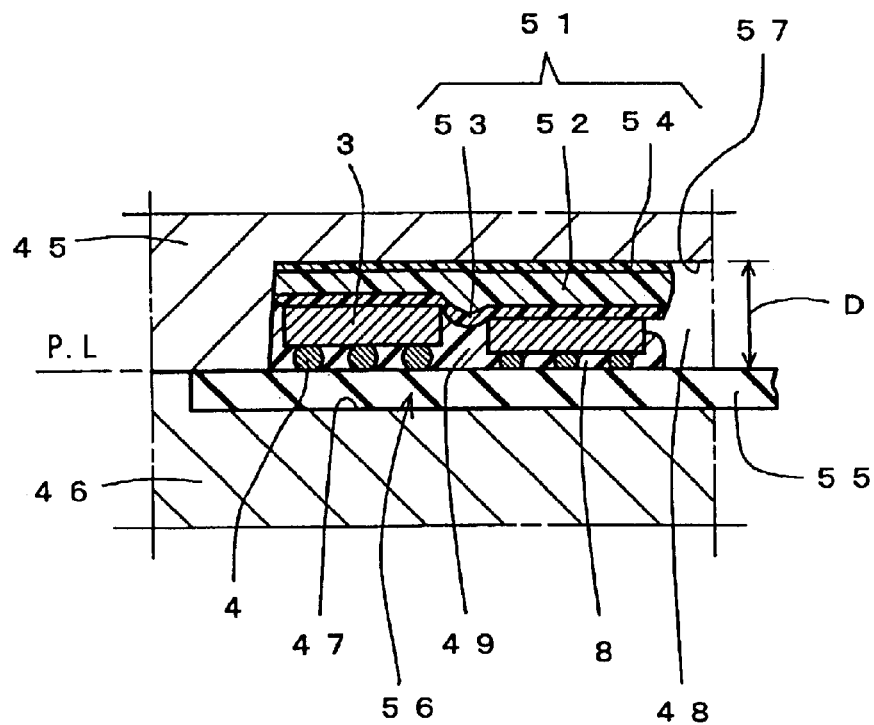
FIG. 16 is a partially fragmented longitudinal sectional view for schematically illustrating the structures of a mold, the semiconductor chip mounted substrate, the resin member and the bonding layer employed for the second exemplary method of manufacturing a semiconductor resin molding according to the fourth embodiment in a closed state of the mold.

As shown in FIGS. 15 and 16, a resin member 51 according to the second example of the fourth embodiment is formed with a bonding layer 54 for preventing misregistration of a resin member 51 and an upper mold section 45, as described later.

As shown in FIG. 15, the resin member 51 has a three-layer structure consisting of a base layer 52 serving as the body of the resin member 51, a bonding layer 53 for preventing formation of clearances attached to upper surfaces 11 of semiconductor chips 3 with adhesion for tentative fixation and the bonding layer 54 for preventing misregistration attached to a top surface 57 of a cavity 48 of the upper mold section 45.

Figure 14:
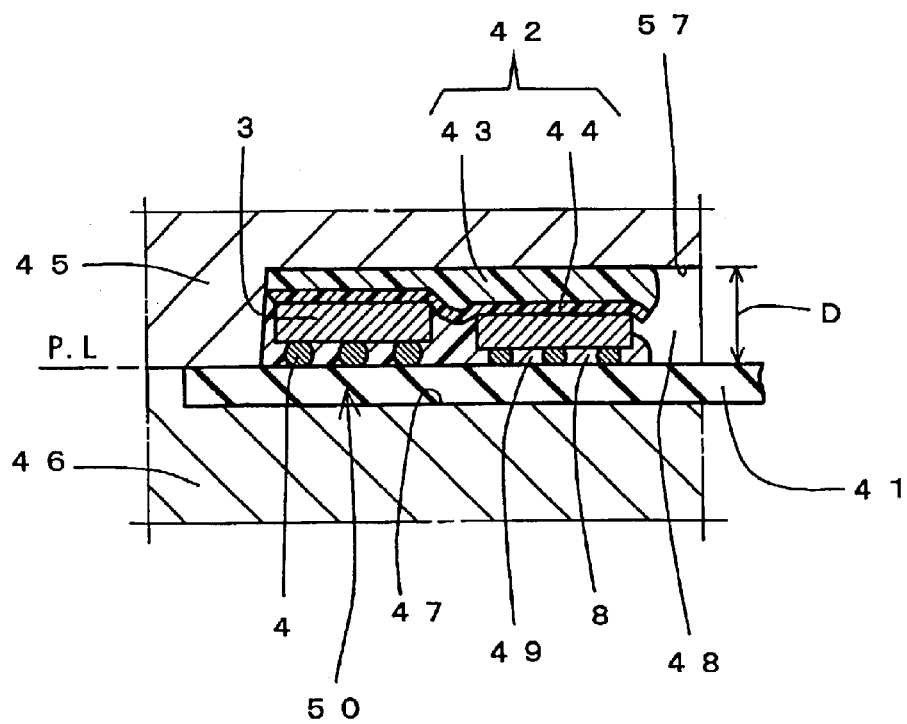
FIG. 14 is a partially fragmented longitudinal sectional view for schematically illustrating the structures of a mold, the semiconductor chip mounted substrate, the resin member and the bonding layer employed for the first exemplary method of manufacturing a semiconductor resin molding according to the fourth embodiment in a closed state of the mold.

A mold and a semiconductor chip mounted substrate 55 shown in FIGS. 15 and 16 are identical in structure to the mold and the substrate 41 shown in FIGS. 13 and 14 respectively, and hence redundant description is not repeated.

In the second example of the method of manufacturing a semiconductor resin molding shown in FIGS. 15 and 16, the top surface 57 of the cavity 48 presses the resin member 51 against the semiconductor chips 3 with prescribed pressure and deforms the same when the upper and lower mold sections 45 and 46 are closed, similarly to the first example of the method of manufacturing a semiconductor resin molding shown in FIGS. 13 and 14. At this time, no clearances are defined between the upper surfaces 11 of the semiconductor chips 3 and the resin member 51 due to synergistic action of the pressure applied to the resin member 51 and the adhesion between the semiconductor chips 3 and the bonding layer 53.

Then, the upper and lower mold sections 45 and 46 are opened thereby obtaining a resin-injected substrate 56 filled up with underfill resin 49 in clearances 8 between the semiconductor chips 3 and the substrate 5. Then, a required portion of the resin-injected substrate 56 is cut so that the resin-injected substrate 56 is divided into individual semiconductor resin moldings.

In the method of manufacturing a semiconductor resin molding shown in FIGS. 15 and 16, the bonding layer 53 for preventing formation of clearances attains an effect similar to that attained by the bonding layer 44 for preventing formation of clearances employed in the method of manufacturing a semiconductor resin molding shown in FIGS. 13 and 14.

The bonding layers 53 and 54 attach the base layer 52 of the resin member 51 to the upper surfaces 11 of the semiconductor chips 3 and the top surface 57 of the cavity 48 of the upper mold section 45 with adhesion for tentative fixation respectively, thereby preventing the resin member 51 from misregistration. Therefore, when a plurality of resin members 33, 34 and 35 are simultaneously arranged in the cavity 48 of the upper mold section 45 as shown in FIG. 9 (second embodiment), for example, the aforementioned mode is more preferable.

In the method of manufacturing a semiconductor resin molding shown in FIGS. 15 and 16, the resin member 51 may alternatively be provided with only the bonding layer 54 for preventing misregistration. The bonding layer 54 preferably has flexibility or elasticity.

In the method of manufacturing a semiconductor resin molding shown in FIGS. 13 and 14 or FIGS. 15 and 16, the mold provided with the adjusting portions 30 on the top surface 29 of the cavity 25 of the upper mold section 21 employed in the method of manufacturing a semiconductor resin molding shown in FIGS. 10, 11 and 12 may be employed.

In the method of manufacturing a semiconductor resin molding shown in FIGS. 13 and 14 or FIGS. 15 and 16, further, the resin member 51 attached to the upper surfaces 11 of the semiconductor chips 3 may be in the form of a tape, a film or an individual section.

The two-layer resin member 42 or the three-layer resin member 51 is preferably prepared from thermosetting resin. Alternatively, the base layer 43 or 52 may be formed by a completely hardened resin layer so that the bonding layer 44 or 53 and the bonding layer 54 are formed by semi-hardened resin layers. The bonding layers 44, 53 and 54 may alternatively be made of an adhesive.

The bonding layers 44, 53 and 54, which may be formed by thermoplastic resin layers, are preferably formed by heat-resistant thermoplastic resin layers.

The base layers 43 and 52 are preferably made of an elastic material such as a thermosetting resin material, a thermoplastic resin material (preferably a heat-resistant thermoplastic resin material) or elastomer, similarly to the single-layer resin member 12 employed in the first embodiment and the like.

(Fifth Embodiment)

A method of manufacturing a semiconductor resin molding according to a fifth embodiment of the present invention is described with reference to FIGS. 17, 18, 19 and 20.

Figure 17:
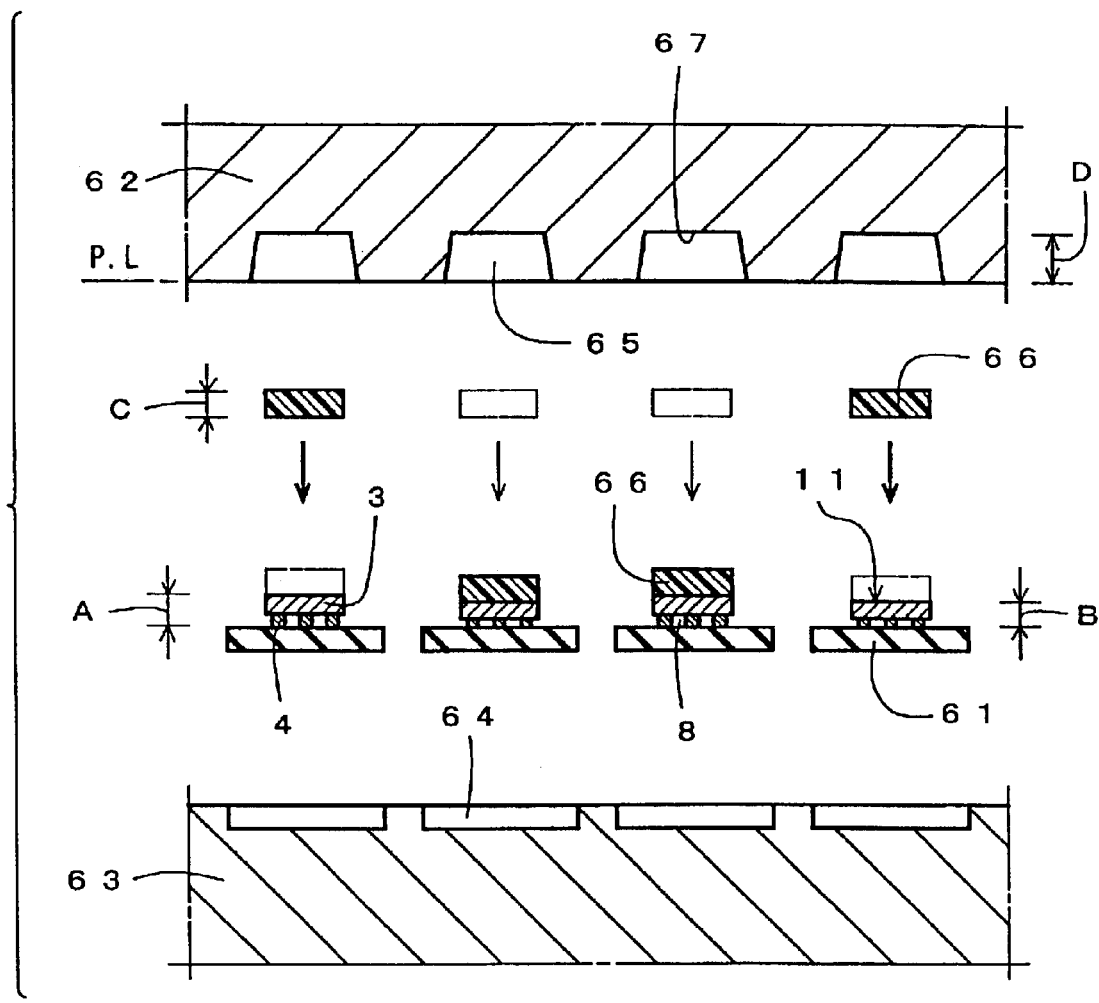
FIG. 17 is a partially fragmented longitudinal sectional view for schematically illustrating the structure of a mold employed for a method of manufacturing a semiconductor resin molding according to a fifth embodiment of the present invention in an open state of the mold.
Figure 18:
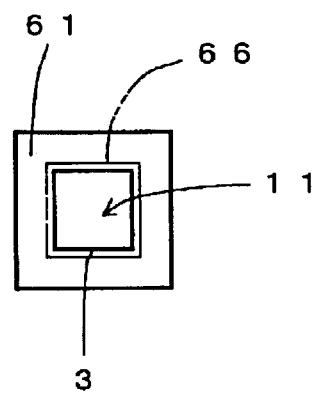
FIG. 18 is a plan view for schematically illustrating the structure of a semiconductor chip mounted substrate employed for the method of manufacturing a semiconductor resin molding according to the fifth embodiment.

In the method of manufacturing a semiconductor resin molding according to this embodiment, a semiconductor chip mounted substrate is formed by integrally mounting a semiconductor chip 3 on each of a plurality of substrates 61 through a bump 4 serving as a connecting electrode, as shown in FIGS. 17 and 18. Heights A and B of the semiconductor chips 3 carried on the plurality of substrates 61 respectively are dispersed. For example, the height A is larger than the height B, as shown in FIG. 17.

According to this embodiment, underfill resin is injected into a plurality of cavities 65 for resin injection provided in an upper mold section 62 of a mold in correspondence to the plurality of substrates 61 (four substrates 61 in FIG. 17) respectively. Further, resin members 66 having a height C are inserted into the plurality of cavities 65 of the upper mold section 62 respectively.

Figure 19:
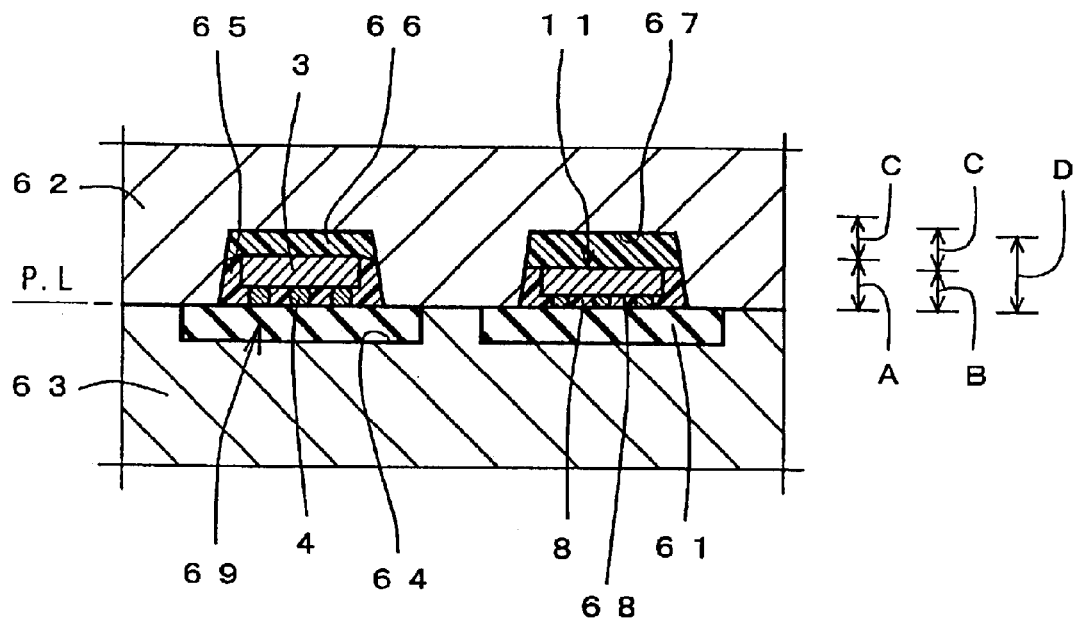
FIG. 19 is a partially fragmented longitudinal sectional view for schematically illustrating the structure of the mold employed for the method of manufacturing a semiconductor resin molding according to the fifth embodiment in a closed state of the mold.

As shown in FIGS. 17 and 19, the mold employed for the method of manufacturing a semiconductor resin molding according to this embodiment comprises the upper mold section 62 fixed in position and a lower mold section 63 movable in position.

The lower mold section 63 is provided with a plurality of cavities (concave portions for setting) 64 for receiving the plurality of substrates 61 respectively. The upper mold section 62 is provided with the cavities 65 for resin injection receiving the plurality of substrates 61 respectively. Therefore, each of the plurality of cavities 65 has an individual height D.

The height D of each cavity 65 is smaller than the sum of the height A or B of each semiconductor chip 3 and the thickness C of each resin member 66.

In each of the plurality of cavities 65, therefore, the resin member 66 attached to the upper surface 11 of each semiconductor chip 3 is pressed (heated) by a top surface 67 of each cavity 65, to be deformed.

The aforementioned method of manufacturing a resin molding according to this embodiment can also attain an effect similar to those attained by the methods of manufacturing semiconductor resin moldings according to the first to third embodiments.

Then, heated and melted underfill resin 68 is individually injected into each of the plurality of cavities 65 to fill up a clearance 8 between each of the plurality of semiconductor chips 3 and each substrate 61. Thus, resin-injected substrates 69 are formed in the plurality of cavities 65 respectively.

Figure 20:
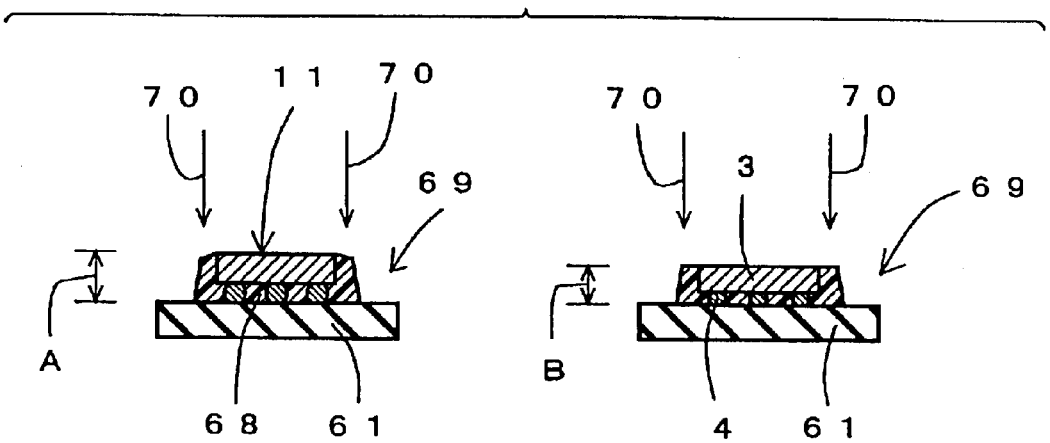
FIG. 20 is a partially fragmented longitudinal sectional view of semiconductor resin moldings manufactured by the method of manufacturing a semiconductor resin molding according to the fifth embodiment.

Then, assumed cut portions of the resin-injected substrates 69 are cut along arrows 70, as shown in FIG. 20. Thus, unnecessary portions are cut off so that the resin-injected substrates 69 are divided into individual semiconductor resin moldings (not shown).

In the method of manufacturing a semiconductor resin molding according to this embodiment, each resin member 66 may be replaced with a two- or three-layer resin member comprising a resin member of the same material as the resin member 66 and a bonding layer.

Further, a thin protective layer may be provided on the surface of the single-layer resin member 66 or the two- or three-layer resin member for protecting the resin member 66.

The resin member 66 having the thin protective layer may be provided with a bonding layer on its surface, similarly to the resin member 42 or 51 shown in FIGS. 13 and 14 or FIGS. 15 and 16.

Also in this case, the method of manufacturing a resin molding according to this embodiment can attain an effect similar to that attained by the method of manufacturing a semiconductor resin molding shown in FIGS. 13 and 14 or FIGS. 15 and 16.

Each of the above embodiments has been described with reference to the mold having the cavity (concave portion for setting) for receiving the semiconductor chip mounted substrate formed by mounting the semiconductor chips on the substrate through the connecting electrodes provided in the lower mold section and the cavity for resin molding provided in the upper mold section. However, the structures of the upper and lower mold sections are not restricted to the aforementioned ones but other structures can alternatively be employed.

For example, the upper mold section may be provided with a cavity (concave portion for setting) for receiving the semiconductor chip mounted substrate formed by mounting the semiconductor chips on the substrate through the connecting electrodes and the lower mold section may be provided with a cavity for resin molding contrarily to the above.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor resin molding comprising steps of:
   preparing a mold having an upper mold section and a lower mold section;
   preparing a semiconductor chip mounted substrate formed by mounting a semiconductor chip on a substrate through a connecting electrode;
   fitting said semiconductor chip mounted substrate into a cavity (concave portion for setting) of said lower mold section;
   injecting underfill resin into a first clearance between said semiconductor chip and said substrate;
   setting a resin member, having an initial thickness larger than the height of a second clearance that will be defined between the top surface of a cavity of said upper mold section and the upper surface of said semiconductor chip when said upper mold section and said lower mold section are closed, on the upper surface of said semiconductor chip; and
   molding said underfill resin while applying pressure from said upper mold section to said resin member by closing said upper mold section and said lower mold section.

2. A method of manufacturing a semiconductor resin molding comprising steps of:
   preparing a mold having an upper mold section and a lower mold section;
   preparing a semiconductor chip mounted substrate formed by mounting a semiconductor chip on a substrate through a connecting electrode;
   fitting said semiconductor chip mounted substrate into a cavity (concave portion for setting) of said upper mold section;
   injecting underfill resin into a first clearance between said semiconductor chip and said substrate;
   setting a resin member, having an initial thickness larger than the height of a second clearance that will be defined between the top surface (bottom surface) of a cavity of said lower mold section and said semiconductor chip when said upper mold section and said lower mold section are closed, on the upper surface (surface) of said semiconductor chip; and
   molding said underfill resin while applying pressure from said lower mold section to said resin member by closing said upper mold section and said lower mold section.

3. A resin member employed for a method of manufacturing a semiconductor resin molding comprising steps of:
   preparing a mold having an upper mold section and a lower mold section;
   preparing a semiconductor chip mounted substrate formed by mounting one semiconductor chip or each of a plurality of semiconductor chips on a substrate through a connecting electrode;
   fitting said semiconductor chip mounted substrate into a cavity (concave portion for setting) provided in either one of said upper mold section and said lower mold section;
   injecting underfill resin into a first clearance between said semiconductor chip and said substrate fitted (supplied/set) into a cavity provided in the other one of said upper mold section and said lower mold section; and
   molding said underfill resin by closing said upper mold section and said lower mold section,
   said resin member having a thickness larger than the height of a second clearance defined between the top surface (bottom surface) of a cavity provided in said mold and the facing surface of said semiconductor chip so that said cavity provided in said mold applies pressure when said upper mold section and said lower mold section are closed after said resin member is set on the upper surface (surface) of said semiconductor chip.

4. The resin member according to claim 3, having a shape and dimensions corresponding to the shape and the dimensions of said semiconductor chip.

5. The resin member according to claim 3, having a shape and dimensions corresponding to the shape and the dimensions of an aggregate of at least two of said plurality of semiconductor chips mounted on said substrate.

6. The resin member according to claim 3, provided with a bonding layer bonded to at least either the top surface (bottom surface) of said cavity provided in said mold or the upper surface (surface) of said semiconductor chip when said upper mold section and said lower mold section are closed.

7. The resin member according to claim 6, wherein said bonding layer is formed by a thermoplastic resin material.

8. The resin member according to claim 6, wherein said bonding layer is formed by a thermosetting resin material.

* * * * *